(12) United States Patent
Seo et al.

(10) Patent No.: US 11,581,423 B2
(45) Date of Patent: Feb. 14, 2023

(54) INTEGRATED CIRCUIT DEVICES INCLUDING AN ELEMENT HAVING A NON-LINEAR SHAPED UPPER SURFACE AND METHODS OF FORMING THE SAME

(71) Applicant: Samsung Electronics Co., Ltd., Suwon-si (KR)

(72) Inventors: Kang Ill Seo, Springfield, VA (US); Joon Goo Hong, Austin, TX (US)

(73) Assignee: Samsung Electronics Co., Ltd., Suwon-si (KR)

( * ) Notice: Subject to any disclaimer, the term of this patent is extended or adjusted under 35 U.S.C. 154(b) by 117 days.

(21) Appl. No.: 16/947,247

(22) Filed: Jul. 24, 2020

(65) Prior Publication Data
US 2021/0384324 A1 Dec. 9, 2021

Related U.S. Application Data

(60) Provisional application No. 63/034,546, filed on Jun. 4, 2020.

(51) Int. Cl.
| | |
|---|---|
| *H01L 21/308* | (2006.01) |
| *H01L 29/66* | (2006.01) |
| *H01L 29/78* | (2006.01) |
| *H01L 29/10* | (2006.01) |

(52) U.S. Cl.
CPC .... *H01L 29/66666* (2013.01); *H01L 21/3081* (2013.01); *H01L 21/3085* (2013.01); *H01L 21/3086* (2013.01); *H01L 29/1037* (2013.01); *H01L 29/66553* (2013.01); *H01L 29/7827* (2013.01)

(58) Field of Classification Search
None
See application file for complete search history.

(56) References Cited

U.S. PATENT DOCUMENTS

| | | | |
|---|---|---|---|
| 10,504,983 B2 | 12/2019 | Li et al. | |
| 10,593,805 B2 | 3/2020 | Campi, Jr. et al. | |
| 2003/0087167 A1* | 5/2003 | Popp | H01L 21/3086 430/5 |
| 2008/0111906 A1 | 5/2008 | Kim et al. | |
| 2013/0200499 A1 | 8/2013 | Liaw et al. | |

(Continued)

FOREIGN PATENT DOCUMENTS

JP   1994267996   9/1994

*Primary Examiner* — Xiaoming Liu
(74) *Attorney, Agent, or Firm* — Myers Bigel, P.A.

(57) ABSTRACT

Integrated circuit devices and methods of forming the same are provided. The methods may include sequentially forming an underlying mask layer and a preliminary first mask layer on a substrate, forming a first mask structure by removing a portion of the preliminary first mask layer, and then forming a preliminary second mask layer. The preliminary second mask layer may enclose the first mask structure in a plan view. The methods may also include forming a second mask structure by removing a portion of the preliminary second mask layer and forming a vertical channel region including a portion of the substrate by sequentially etching the underlying mask layer and the substrate. The second mask structure may be connected to the first mask structure, and etching the underlying mask layer may be performed using the first and the second mask structures as an etch mask.

19 Claims, 11 Drawing Sheets

(56) References Cited

U.S. PATENT DOCUMENTS

| | | | |
|---|---|---|---|
| 2013/0309853 A1* | 11/2013 | Sung | H01L 21/31144 438/689 |
| 2014/0131832 A1* | 5/2014 | Yang | H01L 29/02 438/778 |
| 2015/0372083 A1* | 12/2015 | Tang | H01L 29/66439 438/268 |
| 2016/0351670 A1 | 12/2016 | Li et al. | |
| 2017/0148687 A1* | 5/2017 | Do | H01L 21/823821 |

* cited by examiner

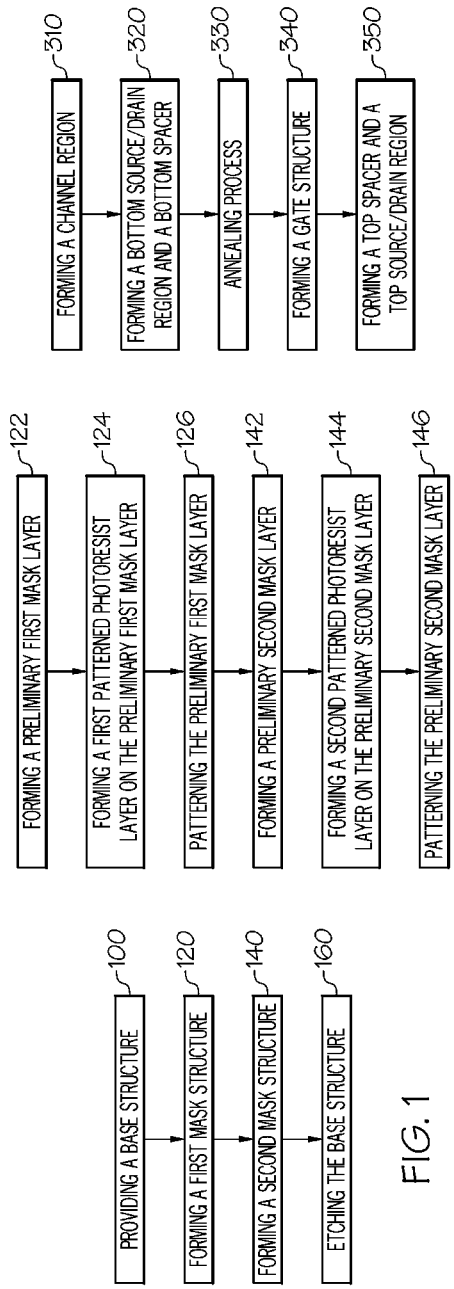

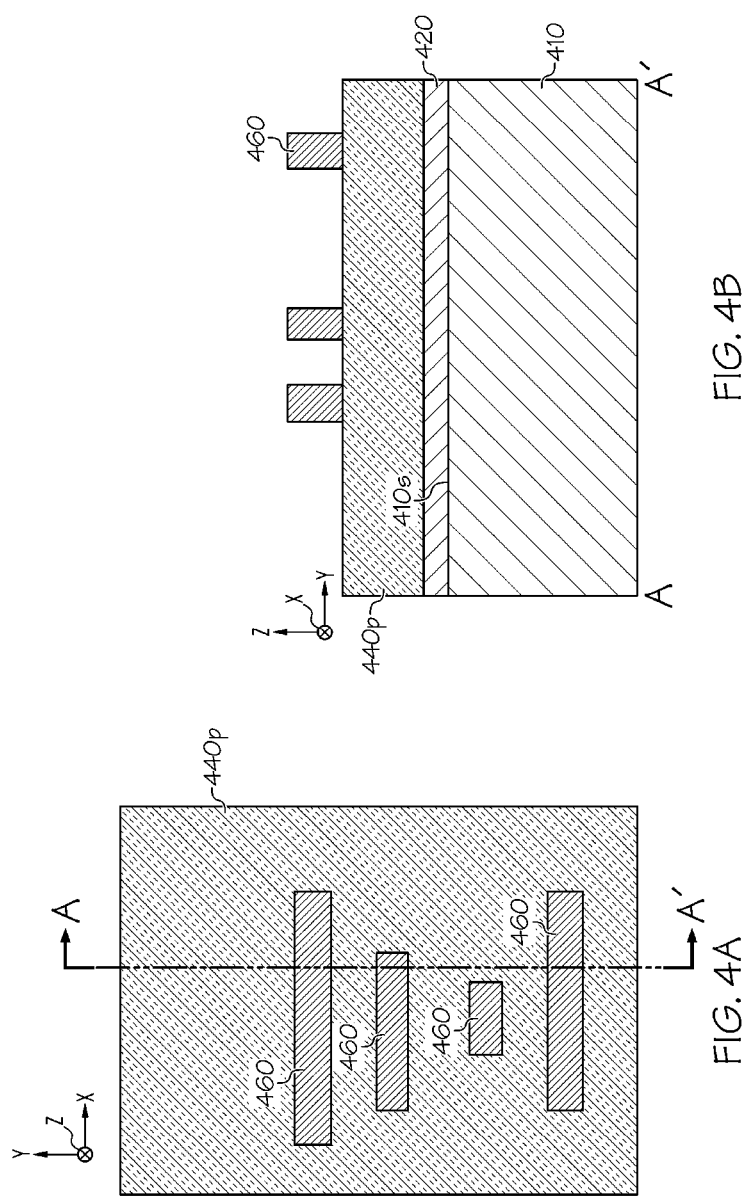

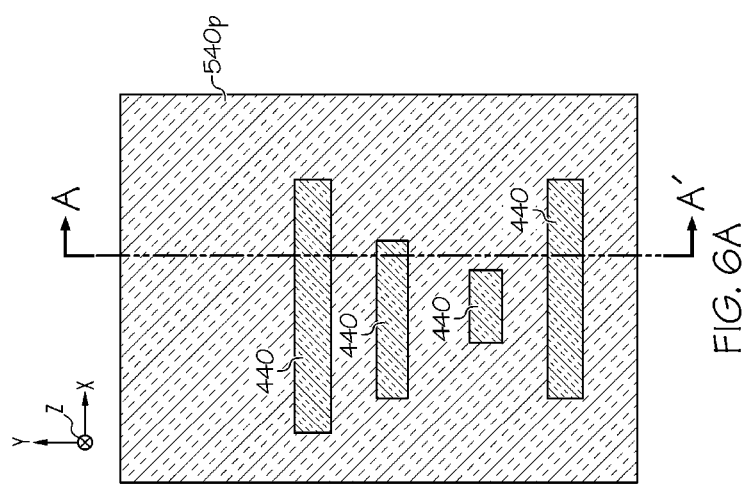
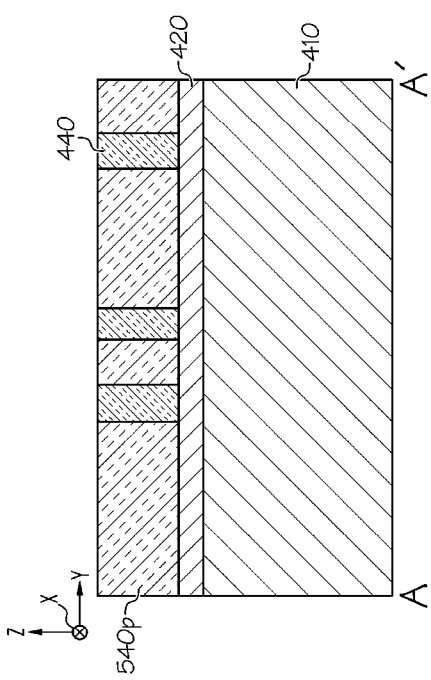
FIG. 6A
FIG. 6B

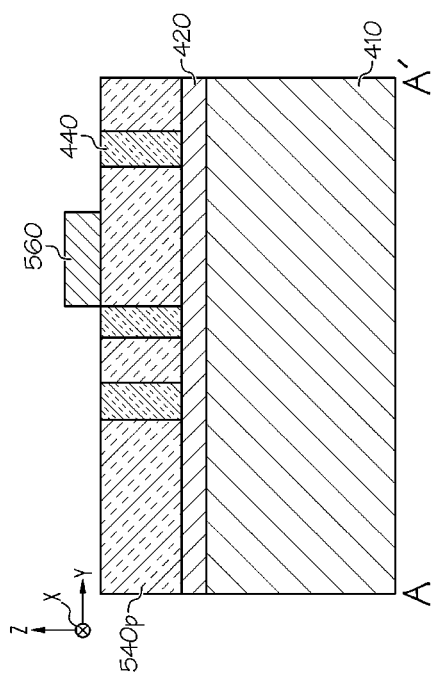
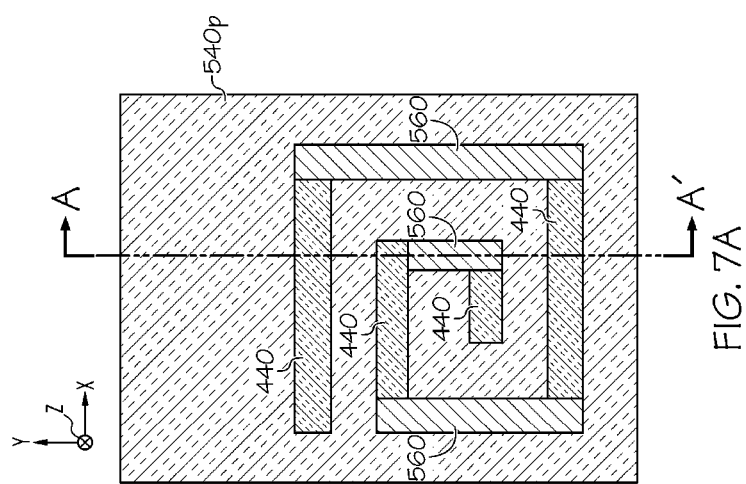
FIG. 7B
FIG. 7A

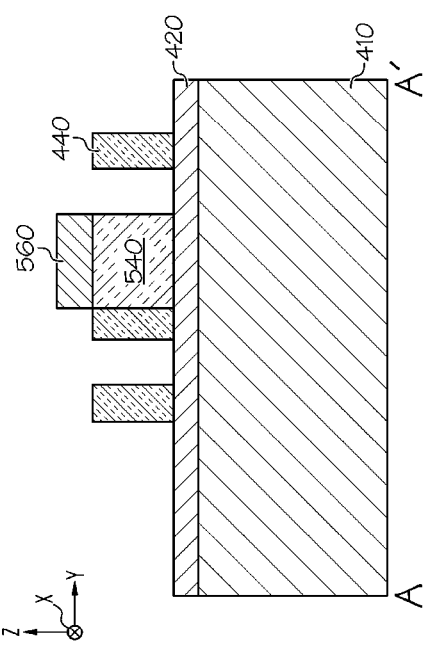
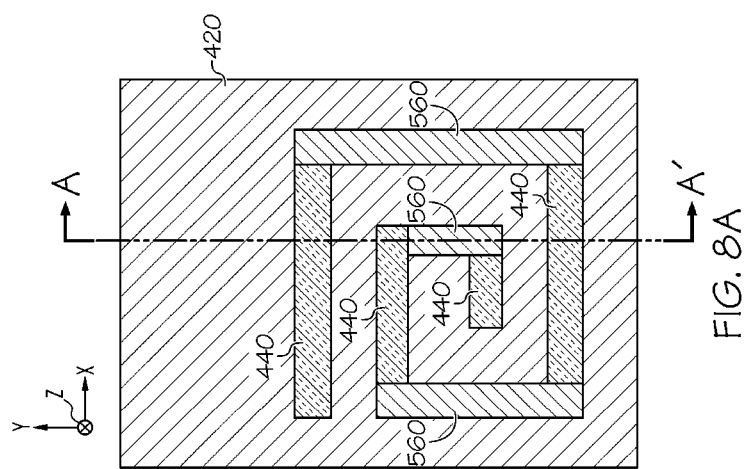
FIG. 8B
FIG. 8A

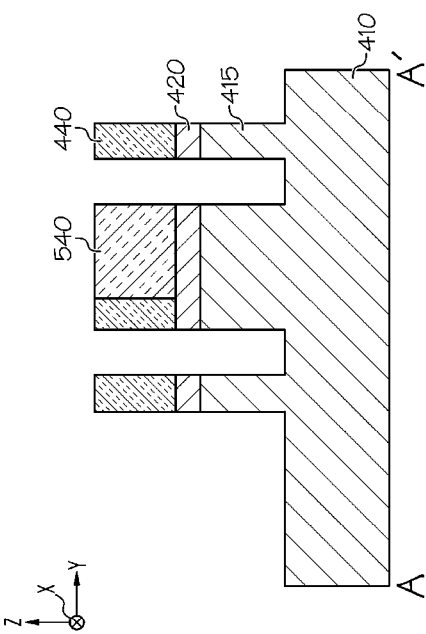
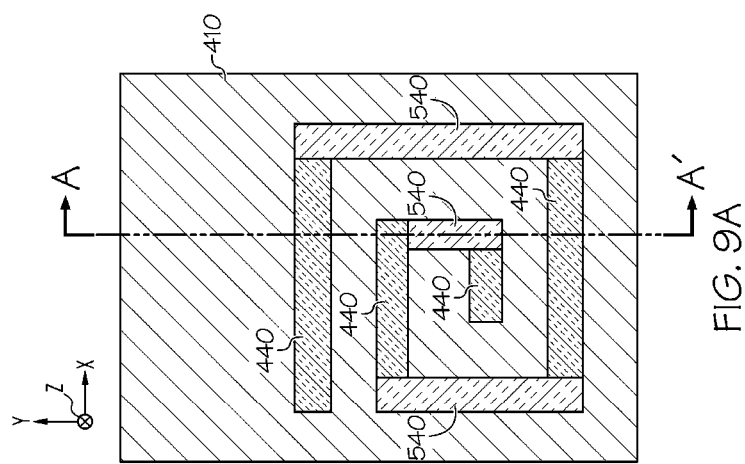
FIG. 9A
FIG. 9B

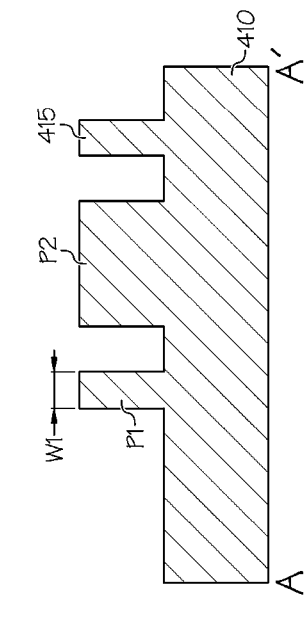
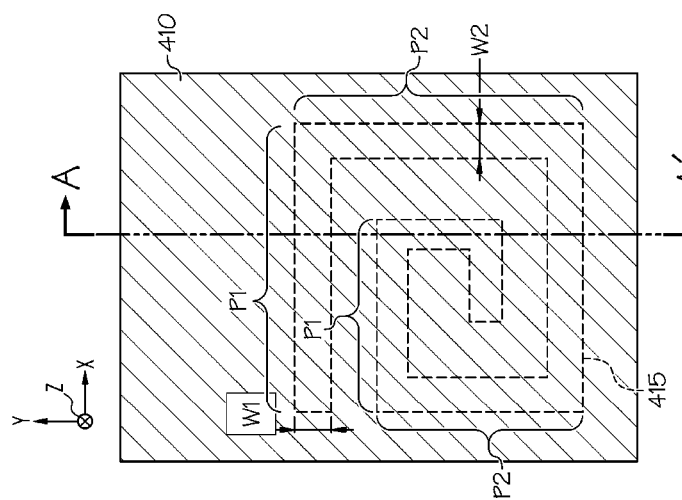
FIG.10B
FIG.10A

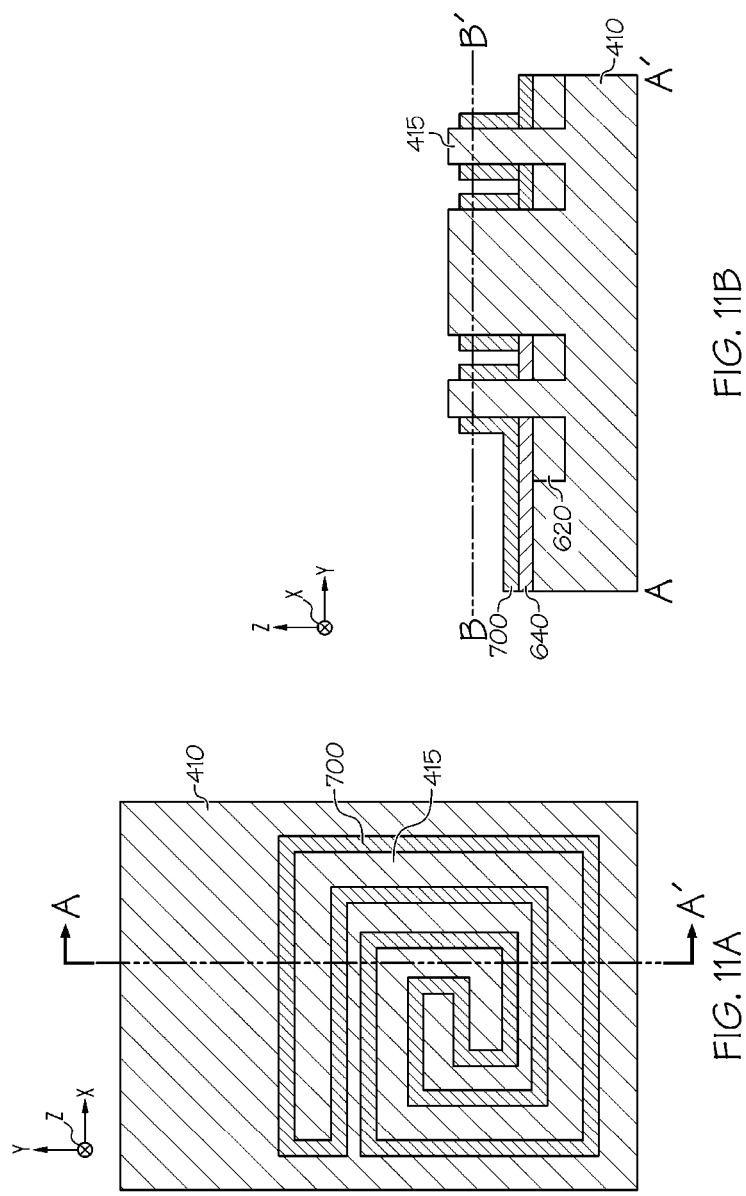

INTEGRATED CIRCUIT DEVICES INCLUDING AN ELEMENT HAVING A NON-LINEAR SHAPED UPPER SURFACE AND METHODS OF FORMING THE SAME

CROSS-REFERENCE TO RELATED APPLICATION

This application claims priority to U.S. Provisional Application Ser. No. 63/034,546, entitled STANDARD CELLS INCLUDING VERTICAL FIELD EFFECT TRANSISTOR AND METHODS OF FORMING THE SAME, filed in the USPTO on Jun. 4, 2020, the disclosure of which is hereby incorporated by reference herein in its entirety.

FIELD

The present disclosure generally relates to the field of electronics and, more particularly, to integrated circuit devices.

BACKGROUND

Various structures and manufacturing processes of integrated circuit devices have been researched to maintain their performance despite a decrease in their sizes. Specifically, various structures of a channel region and a gate electrode and manufacturing processes thereof have been researched to maintain a current level flowing through the channel region and/or gate controllability over the channel region at a desired level.

SUMMARY

According to some embodiments of the present inventive concept, methods of forming an integrated circuit device including a vertical field effect transistor (VFET) may include providing a substrate, sequentially forming an underlying mask layer and a preliminary first mask layer on the substrate, forming a first mask structure on the underlying mask layer by removing a portion of the preliminary first mask layer, and then forming a preliminary second mask layer on the underlying mask layer. The preliminary second mask layer may enclose the first mask structure in a plan view. The methods may also include forming a second mask structure on the underlying mask layer by removing a portion of the preliminary second mask layer and forming a vertical channel region including a portion of the substrate by sequentially etching the underlying mask layer and the substrate. The second mask structure may be connected to the first mask structure, and etching the underlying mask layer may be performed using the first mask structure and the second mask structure as an etch mask.

According to some embodiments of the present inventive concept, methods of forming an integrated circuit device may include providing a base structure and forming a mask structure on the base structure. Forming the mask structure may include forming two first mask structures that each extend in a first direction and then forming a second mask structure that extends in a second direction traversing the first direction and connects the two first mask structures. The two first mask structures and the second mask structure may include different materials. The methods may also include etching the base structure using the mask structure as an etch mask.

According to some embodiments of the present inventive concept, methods of forming an integrated circuit device including a vertical field effect transistor (VFET) may include forming a vertical channel region including a rectangular spiral shaped upper surface on a substrate using a mask structure as an etch mask. The mask structure may include a rectangular spiral shaped upper surface. The mask structure may include a plurality of first portions that each have a linear shape extending in a first direction, a plurality of second portions that each have a linear shape extending in a second direction traversing the first direction, and the plurality of first portions are connected alternately with the plurality of second portions. The plurality of first portions may include a first material, and the plurality of second portions may include a second material that is different from the first material.

BRIEF DESCRIPTION OF THE DRAWINGS

FIGS. 1 and 2 are flow charts of methods of forming an integrated circuit device including an element having a non-linear shaped upper surface according to some embodiments of the present inventive concept.

FIG. 3 is a flow chart of methods of forming an integrated circuit device including a VFET according to some embodiments of the present inventive concept.

FIGS. 4A, 5A, 6A, 7A, 8A, 9A, and 10A are plan views illustrating a method of forming an integrated circuit device including an element having a non-linear shaped upper surface according to some embodiments of the present inventive concept, and FIGS. 4B, 5B, 6B, 7B, 8B, 9B, and 10B are cross-sectional views taken along the line A-A' respectively in FIGS. 4A, 5A, 6A, 7A, 8A, 9A, and 10A.

FIG. 11A is a sectional view taken along the line B-B' in FIG. 11B illustrating a method of forming an integrated circuit device including a VFET according to some embodiments of the present inventive concept, and FIG. 11B is a cross-sectional view taken along the line A-A' in FIG. 11A.

DETAILED DESCRIPTION

Figure 5B:
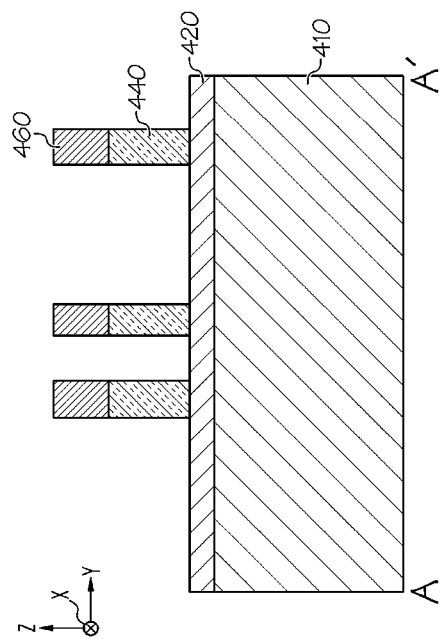
Figure 5A:
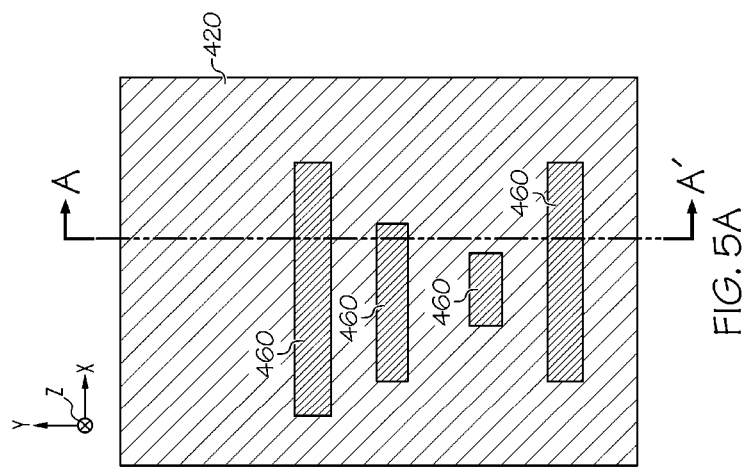

When a channel region of a VFET has a linear shape in a plan view, an effective channel width (Weff) of the VFET is limited by a width or height of a unit cell (e.g., a standard cell) including the VFET. Accordingly, it may be difficult to maintain current flowing through a channel region at a desired level as a width and/or height of a unit cell decreases. Further, when a channel region of a VFET has a closed shape in a plan view, a gate signal may be applied only to a portion of a gate electrode extending on an outer side surface of the channel region, and gate controllability over the channel region may be limited.

According to some embodiments of the present inventive concept, a channel region of a VFET may have a non-linear shape in a plan view including at least one bent portion (e.g., a turn) to increase a channel width without increasing a surface area of a unit cell including the VFET. Further, a VFET may have a non-closed shape in a plan view such that a gate signal may be applied to portions of a gate electrode extending on both an inner side surface and an outer side surface of the channel region such that gate controllability over the channel region may be improved. In some embodiments, a channel region of a VFET may have a non-linear shape in a plan view including multiple bent portions (e.g., a rectangular spiral shape) and may have a non-linear shaped upper surface. In some embodiment, a channel region of a VFET may have a square spiral shape.

Further, it may be difficult to form an element (e.g., a channel region of a VFET) having a non-linear shape using a conventional lithography process. According to some embodiments of the present inventive concept, an etch mask for forming an element having a non-linear shape may be formed by sequentially performing separate lithography processes, each of which forms a mask structure having a linear shape, such that the element having a non-linear shape may be formed using a conventional lithography process.

FIGS. 1 and 2 are flow charts of methods of forming an integrated circuit device including an element having a non-linear shaped upper surface according to some embodiments of the present inventive concept. FIG. 3 is a flow chart of methods of forming an integrated circuit device including a VFET according to some embodiments of the present inventive concept. In some embodiments, the methods discussed herein with reference to FIGS. 1 and 2 may be used to form a channel region of a VFET that is formed using the methods discussed herein with reference to FIG. 3.

FIGS. 4A, 5A, 6A, 7A, 8A, 9A, and 10A are plan views illustrating a method of forming an integrated circuit device including an element having a non-linear shaped upper surface according to some embodiments of the present inventive concept, and FIGS. 4B, 5B, 6B, 7B, 8B, 9B, and 10B are cross-sectional views taken along the line A-A' respectively in FIGS. 4A, 5A, 6A, 7A, 8A, 9A, and 10A.

Referring to FIGS. 1, 2, 4A, and 4B, a method forming an integrated circuit device may include providing a base structure (Block 100 in FIG. 1) that includes a substrate 410 and an underlying mask layer 420 that is on top of the substrate 410. The substrate 410 may include various layers that are patterned using the methods discussed herein and may not be necessarily a wafer. For example, the substrate 410 may include one or more semiconductor materials, such as Si, Ge, SiGe, GaP, GaAs, SiC, SiGeC and/or InP. In some embodiments, the substrate 410 may be a bulk substrate (e.g., a bulk silicon wafer) or a semiconductor on insulator (SOI) substrate. In some embodiments, the substrate 410 may include a conductive layer (e.g., a metal layer) formed on a wafer.

In some embodiments, the underlying mask layer 420 may include an inorganic material. For example, the underlying mask layer 420 may include a hardmask material such as silicon nitride or silicon oxyntride. Although FIG. 4B illustrates the underlying mask layer 420 as a single layer, the underlying mask layer 420 may include multiple layers sequentially stacked on the substrate 410.

The method may also include forming a first mask structure (Block 120 in FIG. 1). Forming the first mask structure (e.g., a mask structure 440 in FIG. 5B) may include forming a preliminary first mask layer 440p (Block 122 in FIG. 2) on the base structure and forming a first patterned photoresist layer 460 (Block 124 in FIG. 2) on the preliminary first mask layer 440p. The preliminary first mask layer 440p may include a material different from the underlying mask layer 420 and have an etch selectivity with respect to the underlying mask layer 420. In some embodiments, the preliminary first mask layer 440p may include an inorganic material. For example, the preliminary first mask layer 440p may include a hardmask material such as silicon nitride or silicon oxyntride. Although FIG. 4B illustrates the preliminary first mask layer 440p as a single layer, the preliminary first mask layer 440p may include multiple layers sequentially stacked on the underlying mask layer 420.

In some embodiments, the first patterned photoresist layer 460 may include multiple first patterned photoresist layers 460 that each may have a linear shape that extends longitudinally in a first direction X. The first patterned photoresist layers 460 may be spaced apart from each other in a second direction Y. In some embodiments, the first patterned photoresist layers 460 may be spaced apart from each other in the second direction Y by a uniform distance as illustrated in FIG. 4A. The underlying mask layer 420, the preliminary first mask layer 440p, and the first patterned photoresist layer 460 may be sequentially stacked on the substrate 410 in a third direction Z.

The first direction X may be parallel to an upper surface 410s of the substrate 410 and may be referred to as a first horizontal direction. The second direction Y may also be parallel to the upper surface 410s of the substrate 410 and may be referred to as a second horizontal direction. In some embodiments, the first direction X may be perpendicular to the second direction Y. The third direction Z may be perpendicular to the upper surface 410s of the substrate 410 and may be referred to as a vertical direction. In some embodiments, the third direction Z may also be perpendicular to both the first direction X and the second direction Y.

Referring to FIGS. 1, 2, 5A, and 5B, forming the first mask structure 440 may include patterning the preliminary first mask layer 440p (Block 126 in FIG. 2). In some embodiments, the preliminary first mask layer 440p may be etched (e.g., dry etched and/or wet etched) using the first patterned photoresist layer 460 as an etch mask until the underlying mask layer 420 is exposed. After the first mask structure 440 is formed, the first patterned photoresist layer 460 may be removed. In some embodiments, the first mask structure 440 may include multiple first mask structures 440 that each may have a linear shape that extends longitudinally in the first direction X. The first mask structures 440 may be spaced apart from each other in the second direction Y. In some embodiments, the first mask structures 440 may be spaced apart from each other in the second direction Y by a uniform distance (See FIG. 6A.)

Referring to FIGS. 1, 2, 6A, 6B, 7A, and 7B, the method may further include forming a second mask structure (Block 140 in FIG. 1). Forming the second mask structure may include forming a preliminary second mask layer 540p (Block 142 in FIG. 2) on the underlying mask layer 420. The preliminary second mask layer 540p may fill (e.g., partially fill or completely fill) spaces between the first mask structures 440. In some embodiments, the preliminary second mask layer 540p may include a flowable material to fill the spaces between the first mask structures 440. The preliminary second mask layer 540p may be formed by, for example, a Chemical Vapor Deposition (CVD) process and/or a spin coating process. The preliminary second mask layer 540p may include a material different from both of the first mask structures 440 and the underlying mask layer 420 and may have an etch selectivity with respect to the first mask structures 440 and the underlying mask layer 420. For example, the preliminary second mask layer 540p may include an organic flowable material such as amorphous carbon.

In some embodiments, the preliminary second mask layer 540p may completely fill the spaces between the first mask structures 440 such that the preliminary second mask layer 540p contacts the underlying mask layer 420 and the first mask structures 440. Specifically, the preliminary second mask layer 540p may contact an upper surface of the underlying mask layer 420 and side surfaces of the first mask structures 440. In some embodiments, the preliminary second mask layer 540p may enclose the first mask structures 440 in a plan view as illustrated in FIG. 6A. In some embodiments, a planarization process (e.g., a chemical mechanical polishing (CMP) process or a blanket etching process) may be performed on the preliminary second mask layer 540p such that an upper surface of the preliminary second mask layer 540p may be coplanar with upper surfaces of the first mask structures 440 as illustrated in FIG. 6B.

Referring to FIGS. 2, 7A, and 7B, forming the second mask structure (e.g., 540 in FIG. 8B) may also include forming a second patterned photoresist layer 560 (Block 144 in FIG. 2) on the preliminary second mask layer 540p. In some embodiments, the second patterned photoresist layer 560 may include multiple second patterned photoresist layers 560 that each may have a linear shape and may extend longitudinally in the second direction Y. The second patterned photoresist layers 560 may be spaced apart from each other in the first direction X.

Referring to FIGS. 2, 8A, and 8B, forming the second mask structure 540 may further include patterning the preliminary second mask layer 540p (Block 146 in FIG. 2). The preliminary second mask layer 540p may be etched (e.g., dry etched and/or wet etched) using the second patterned photoresist layers 560 as an etch mask until the underlying mask layer 420 is exposed. After the second mask structure 540 is formed, the second patterned photoresist layers 560 may be removed.

Referring to FIGS. 9A and 9B, in some embodiments, the second mask structure 540 may include multiple second mask structures 540 that each may have a linear shape that extends longitudinally in the second direction Y. The second mask structures 540 may be spaced apart from each other in the first direction X.

In some embodiments, the first mask structures 440 may be connected alternately with the second mask structures 540 as illustrated in FIG. 9A. The first mask structures 440 may be directly connected with the second mask structures 540 without a gap or an intervening element as illustrated in FIG. 9A. The first mask structures 440 and the second mask structure 540 may be collectively referred to as a mask structure. The mask structure including the first mask structures 440 and the second mask structures 540 may have a rectangular spiral shaped upper surface. It will be understood that, in some embodiments, an upper surface of the mask structure may have a different shape given the relative arrangements of the first mask structures 440 and the second mask structures 540. For example, the mask structure including the first mask structures 440 and the second mask structures 540 may have a square spiral shaped upper surface as illustrated in FIG. 9A. Further, the mask structure including the first mask structures 440 and the second mask structures 540 may have a non-closed (i.e., open) shape in a plan view as illustrated in FIG. 9A.

Although FIG. 9A shows the mask structure including four first mask structures 440 and three second mask structures 540, the present inventive concept is not limited thereto. In some embodiments, the mask structure may include three or fewer first mask structures 440 or five or more first mask structures 440 and may include one or two second mask structures 540 or four or more second mask structures 540. For example, the mask structure may include two first mask structures 440 and a single second mask structure 540 connecting the two first mask structures 440.

Referring to FIGS. 1, 9A, and 9B, the method may further include etching the base structure (Block 160 in FIG. 1) using the mask structure that includes the first mask structures 440 and the second mask structures 540 as an etch mask. Etching the base structure may include sequentially etching the underlying mask layer 420 and the substrate 410 to form a protruding portion 415 of the substrate 410 by performing an etch process (e.g., a dry etch process and/or wet etch process). In some embodiments, the underlying mask layer 420 and the substrate 410 may be sequentially etched using the first mask structures 440 and the second mask structures 540 as an etch mask as illustrated in FIG. 9B. The first mask structures 440 and the second mask structures 540 each may have an etch selectivity with respect to the underlying mask layer 420 and/or the substrate 410, and thus the underlying mask layer 420 and/or the substrate 410 can be etched using the mask structure as an etch mask.

In some embodiments, the underlying mask layer 420 may be etched using the first mask structures 440 and the second mask structures 540 as an etch mask and then the first mask structures 440 and the second mask structures 540 may be removed to expose the upper surface of the underlying mask layer 420. After then, the substrate 410 may be etched using the underlying mask layer 420 as an etch mask.

Referring to FIGS. 10A and 10B, the first mask structures 440, the second mask structures 540, and the underlying mask layer 420 may be removed to expose an upper surface of the protruding portion 415. The protruding portion 415 may be a portion of the substrate 410 protruding from a base portion of the substrate 410 in the third direction Z. The protruding portion 415 may have a rectangular (e.g., square) spiral shaped upper surface and may have a non-closed shape in a plan view as illustrated in FIG. 10A.

The protruding portion 415 may include first portions P1 extending longitudinally in the first direction X. Each of the first portions P1 may have a first width W1 in the second direction Y in a range of about 4 nm to about 10 nm. The protruding portion 415 may also include second portions P2 extending longitudinally in the second direction Y. Each of the second portions P2 may have a second width W2 in the first direction X in a range of about 4 nm to about 10 nm. In some embodiments, the first width W1 and the second width W2 may be equal, and the protruding portion 415 may have a uniform width as illustrated in FIG. 10A.

According to some embodiments of the present inventive concept, the method of forming the protruding portion 415 may be used to form a channel region of a VFET (e.g., an N-type VFET or a P-type VFET). Accordingly, the protruding portion 415 may be also referred to as a channel region herein. The channel region 415 may include silicon and/or germanium. For example, the channel region 415 may be a silicon layer or silicon germanium layer. In some embodiments, the channel region 415 may include impurity elements (e.g., boron, phosphorus, or arsenic).

Referring to FIGS. 3, 11A and 11B, a method of forming a VFET may include forming a channel region 415 (Block 310) using the methods discussed herein with reference to FIGS. 1 through 10B. FIG. 11A is a sectional view taken along the line B-B' in FIG. 11B illustrating a method of forming an integrated circuit device including a VFET according to some embodiments of the present inventive concept, and FIG. 11B is a cross-sectional view taken along the line A-A' in FIG. 11A.

Although FIG. 11A shows the channel region 415 having six bent portions (i.e., turns), the present inventive concept is not limited thereto. For high performance computing applications, the channel region 415 may include more bent portions such that a transistor may have a wider channel width. For mobile computing applications, the channel region 415 may include fewer bent portions such that a transistor may consume less power.

The method may also include forming at least one bottom source/drain region 620 and a bottom spacer 640 (Block 320). The bottom source/drain regions 620 may be formed in the substrate 410 adjacent to the channel region 415. For example, the bottom source/drain regions 620 may be formed by adding impurity elements (e.g., boron, phosphorus, or arsenic) into portions of the substrate 410. The impurities may be added by, for example, an ion implantation process. In some embodiments, the impurities may have a conductivity type (e.g., N-type conductivity or P-type conductivity) different from the channel region 415.

The bottom spacer 640 may be formed on the substrate 410. In some embodiments, the bottom spacer 640 may have a uniform thickness in the third direction Z as illustrated in FIG. 11B. For example, the bottom spacer 640 may be formed by depositing a preliminary bottom spacer layer and then etching the preliminary bottom spacer layer. The bottom spacer 640 may include an insulating material to electrically insulate the bottom source/drain regions 620 from a gate structure 700 that is subsequently formed. For example, the bottom spacer 640 may include a silicon layer including nitrogen and/or oxygen.

The method of forming a VFET may also include an annealing process (Block 330 in FIG. 3). For example, the annealing process may be performed in an ambient hydrogen atmosphere at a temperature in a range of 200° C. to 300° C. In some embodiments, the annealing process may be omitted or may be performed at different stages. Further, in some embodiments, the annealing process may be performed multiple times at various process conditions.

The method of forming a VFET may further include forming a gate structure 700 (Block 340 in FIG. 3) on the bottom spacer 640. The bottom spacer 640 may separate the bottom source/drain regions 620 and the gate structure 700, and the gate structure 700 may be spaced apart from the bottom source/drain regions 620 in the third direction Z. The gate structure 700 may enclose the channel region 415 in a plan view as illustrated in FIG. 11A, and the gate structure 700 may continuously horizontally around a surface of the channel region 415, including opposing sides of the channel region 415. Accordingly, a gate signal can be applied to the entire gate electrode (e.g., a gate electrode 720 in FIG. 13).

Figure 12:
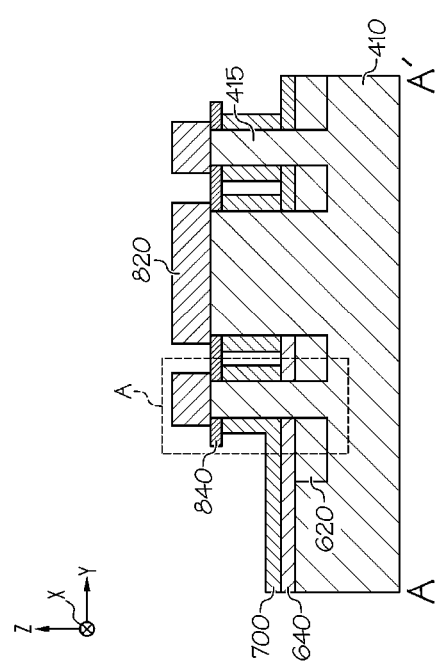
FIG. 12 is a cross-sectional view taken along the line A-A' in FIG. 11A illustrating a method of forming an integrated circuit device including a VFET according to some embodiments of the present inventive concept.

Referring to FIGS. 3 and 12, the method of forming a VFET may additionally include forming a top spacer 840 and a top source/drain region 820 on the channel region 415 (Block 350 in FIG. 3). FIG. 12 is a cross-sectional view taken along the line A-A' in FIG. 11A illustrating a method of forming an integrated circuit device including a VFET according to some embodiments of the present inventive concept.

The top spacer 840 may have a uniform thickness in the third direction Z as illustrated in FIG. 12. For example, the top spacer 840 may be formed by depositing a preliminary top spacer layer and then etching the preliminary top spacer layer. The top spacer 840 may include an insulating material to electrically insulate the gate structure 700 from a top source/drain region 820 that is subsequently formed. For example, the top spacer 840 may include a silicon layer including nitrogen and/or oxygen.

In some embodiments, the top source/drain region 820 may be formed by performing an epitaxial growth process using the channel region 415 as a seed layer and may have a shape in a plan view similar to a shape of the channel region 415 illustrated in FIG. 11A. For example, the top source/drain region 820 may also have a rectangular (e.g., square) spiral upper surface.

The top spacer 840 may separate the top source/drain region 820 and the gate structure 700, and the top source/drain region 820 may be spaced apart from the gate structure 700 in the third direction Z.

Figure 13:
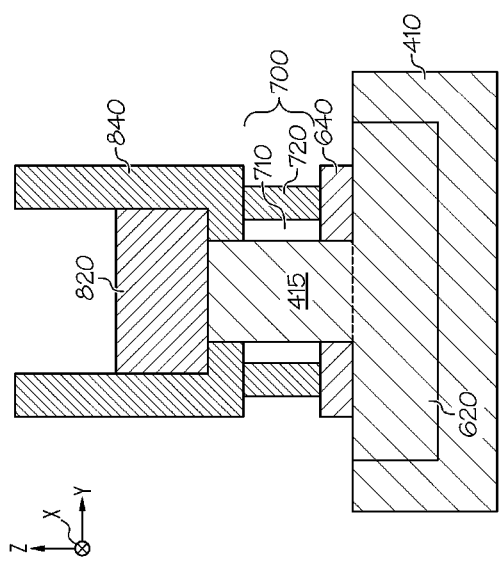
FIGS. 13 and 14 are cross-sectional views of the region A in FIG. 12 according to some embodiments of the present inventive concept.
Figure 14:
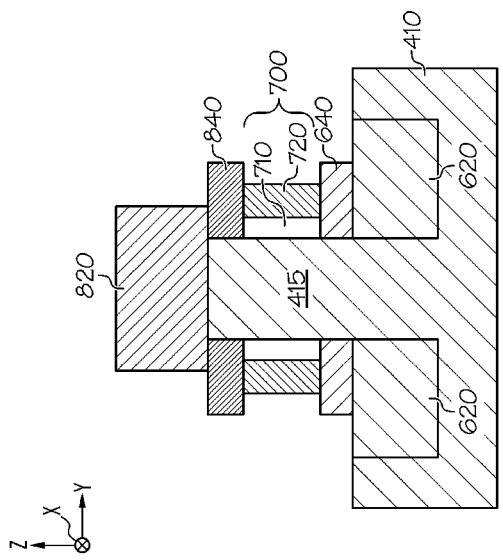

FIGS. 13 and 14 are cross-sectional views of the region A in FIG. 12 according to some embodiments of the present inventive concept. Referring to FIG. 13, the gate structure 700 may include a gate insulator 710 and a gate electrode 720 sequentially formed on a side surface of the channel region 415. The gate insulator 710 may be between the channel region 415 and the gate electrode 720 to electrically isolate the channel region 415 from the gate electrode 720. Although FIG. 13 illustrates each of the gate insulator 710 and the gate electrode 720 as a single layer, each of the gate insulator 710 and the gate electrode 720 may include multiple layers. Although not shown in FIGS. 13 and 14, an interfacial layer may be formed between the channel region 415 and the gate insulator 710.

The gate insulator 710 may include, for example, a silicon oxide layer, a silicon oxynitride layer, and/or a high k material layer (e.g., hafnium oxide layer) that has a dielectric constant greater than silicon dioxide. For example, the gate insulator 710 may include a silicon oxide layer stacked with a tantalum oxide layer, a titanium oxide layer or lanthanum oxide layer.

In some embodiments, the gate electrode 720 may include a work function controlling layer (e.g., a titanium nitride layer, a tantalum nitride layer), a diffusion barrier layer, and/or a conductive layer (e.g., a semiconductor layer, a metal layer) stacked on the gate insulator 710. For example, gate electrode 720 may include multiple layers including a titanium layer, a titanium nitride layer, a titanium aluminum carbide layer and/or a tantalum nitride layer.

A VFET illustrated in FIG. 14 is similar to the VFET illustrated in FIG. 13 but different with respect to a relationship between the channel region 415 and the bottom source/drain regions 620 and a shape of the top spacer 840. In some embodiments, the channel region 415 may vertically overlap the bottom source/drain region 620 as illustrated in FIG. 14. The phrase "an element A vertically overlapping an element B" (or similar language) as used herein means that a vertical line exists that intersects both the elements A and B. In some embodiments, the bottom source/drain regions 620 may be formed in the substrate 410 before the channel region 415 is formed.

Further, in some embodiments, the top spacer 840 may include protruding portions that protrude in the third direction Z and define a space therebetween. The top source/drain region 820 may be formed in the space as illustrated in FIG. 14.

Example embodiments are described herein with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete and will convey the scope of the disclosure to those skilled in the art. In the drawings, the sizes and relative sizes of layers and regions may be exaggerated for clarity. Like reference numbers refer to like elements throughout.

Example embodiments of the present inventive concept are described herein with reference to cross-sectional views or plan views that are schematic illustrations of idealized embodiments and intermediate structures of example embodiments. As such, variations from the shapes of the illustrations as a result, for example, of manufacturing techniques and/or tolerances, are to be expected. Thus, example embodiments of the present inventive concept should not be construed as limited to the particular shapes illustrated herein but include deviations in shapes that result, for example, from manufacturing.

Unless otherwise defined, all terms (including technical and scientific terms) used herein have the same meaning as commonly understood by one of ordinary skill in the art to which the present inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The terminology used herein is for the purpose of describing particular embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes" and/or "including," when used in this specification, specify the presence of the stated features, steps, operations, elements and/or components, but do not preclude the presence or addition of one or more other features, steps, operations, elements, components and/or groups thereof. As used herein the term "and/or" includes any and all combinations of one or more of the associated listed items.

It will be understood that although the terms first, second, etc. may be used herein to describe various elements, these elements should not be limited by these terms. These terms are only used to distinguish one element from another. Thus, a first element could be termed a second element without departing from the teachings of the present inventive concept.

It should be noted that in some alternate implementations, the functions/acts noted in flowchart blocks herein may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated, and/or blocks/operations may be omitted without departing from the scope of the present inventive concept.

The above-disclosed subject matter is to be considered illustrative, and not restrictive, and the appended claims are intended to cover all such modifications, enhancements, and other embodiments, which fall within the true spirit and scope of the present inventive concept. Thus, to the maximum extent allowed by law, the scope is to be determined by the broadest permissible interpretation of the following claims and their equivalents, and shall not be restricted or limited by the foregoing detailed description.

What is claimed is:

1. A method of forming an integrated circuit device comprising a vertical field-effect transistor (VFET), the method comprising:
    providing a substrate;
    sequentially forming an underlying mask layer and a preliminary first mask layer on the substrate;
    forming a first mask structure on the underlying mask layer by removing a portion of the preliminary first mask layer, wherein the first mask structure comprises a plurality of first mask structures that each have a linear shape extending in a first direction;
    after forming the first mask structure, forming a preliminary second mask layer on the underlying mask layer, wherein the preliminary second mask layer encloses the first mask structure in a plan view;
    forming a second mask structure on the underlying mask layer by removing a portion of the preliminary second mask layer, wherein the second mask structure comprises a plurality of second mask structures that each have a linear shape extending in a second direction that is perpendicular to the first direction,
    wherein the plurality of first mask structures and the plurality of second mask structures collectively comprise a rectangular spiral shaped upper surface, and the plurality of first mask structures are connected alternately with the plurality of second mask structures along a rotation direction of the rectangular spiral shaped upper surface, and
    wherein lengths of the plurality of first mask structures in the first direction decrease along the rotation direction of the rectangular spiral shaped upper surface, and lengths of the plurality of second mask structures in the second direction decrease along the rotation direction of the rectangular spiral shaped upper surface; and
    forming a vertical channel region comprising a portion of the substrate by sequentially etching the underlying mask layer and the substrate, wherein etching the underlying mask layer and the substrate is performed using the first mask structure and the second mask structure as an etch mask.

2. The method of claim 1, wherein the plurality of first mask structures comprise an inorganic material, and the plurality of second mask structures comprise an organic material.

3. The method of claim 2, wherein the underlying mask layer comprises a first inorganic material, and the plurality of first mask structures comprise a second inorganic material that is different from the first inorganic material.

4. The method of claim 1, wherein forming the first mask structure comprises:
    forming a first patterned photoresist layer on the preliminary first mask layer; and
    etching the preliminary first mask layer using the first patterned photoresist layer as an etch mask until the underlying mask layer is exposed.

5. The method of claim 4, wherein forming the second mask structure comprises:
    forming a second patterned photoresist layer on the first mask structure and the preliminary second mask layer; and
    etching the preliminary second mask layer using the second patterned photoresist layer as an etch mask until the underlying mask layer is exposed.

6. The method of claim 1, wherein the vertical channel region comprises a rectangular spiral shaped upper surface and protrudes from the substrate in a vertical direction, and wherein the method further comprises:
    forming a gate electrode on a side surface of the vertical channel region; and
    forming a top source/drain region on the vertical channel region, wherein the gate electrode is between the substrate and the top source/drain region and is spaced apart from the top source/drain region in the vertical direction.

7. The method of claim 6, wherein the gate electrode encloses the vertical channel region in a plan view.

8. The method of claim 1, wherein upper surfaces of the plurality of first mask structures and the plurality of second mask structures are coplanar with each other.

9. A method of forming an integrated circuit device, the method comprising:
providing a base structure;
forming a mask structure on the base structure, wherein forming the mask structure comprises forming a plurality of first mask structures and then forming a plurality of second mask structures; and
etching the base structure using the mask structure as an etch mask,
wherein the plurality of first mask structures each have a linear shape extending in a first direction, and the plurality of second mask structures each have a linear shape extending in a second direction that is perpendicular to the first direction,
the plurality of first mask structures and the plurality of second mask structures collectively comprise a rectangular spiral shaped upper surface, and the plurality of first mask structures are connected alternately with the plurality of second mask structures along a rotation direction of the rectangular spiral shaped upper surface, and
lengths of the plurality of first mask structures in the first direction decrease along the rotation direction of the rectangular spiral shaped upper surface, and lengths of the plurality of second mask structures in the second direction decrease along the rotation direction of the rectangular spiral shaped upper surface.

10. The method of claim 9, wherein forming the plurality of second mask structures comprises:
forming a preliminary second mask layer on the base structure, the preliminary second mask layer enclosing the plurality of first mask structures in a plan view; and
forming the plurality of second mask structures by patterning the preliminary second mask layer.

11. The method of claim 10, wherein the preliminary second mask layer comprises a lower surface facing the base structure, the plurality of first mask structures each comprise a lower surface facing the base structure, and an upper surface of the preliminary second mask layer is coplanar with upper surfaces of the plurality of first mask structures.

12. The method of claim 10, wherein the plurality of first mask structures comprise an inorganic material, and the preliminary second mask layer comprises an organic material.

13. The method of claim 12, wherein the preliminary second mask layer comprises an amorphous carbon layer.

14. The method of claim 9, wherein the base structure comprises a base layer and an underlying mask layer, and the underlying mask layer extends between the mask structure and the base layer after forming the mask structure, and wherein etching the base structure comprises etching the underlying mask layer using the mask structure as an etch mask and then etching the base layer.

15. A method of forming an integrated circuit device comprising a vertical field-effect transistor (VFET), the method comprising:
forming a vertical channel region on a substrate by etching the substrate using a mask structure as an etch mask,
wherein the mask structure comprises a rectangular spiral shaped upper surface,
the mask structure comprises a plurality of first portions that each have a linear shape extending in a first direction, a plurality of second portions that each have a linear shape extending in a second direction traversing the first direction, and the plurality of first portions are connected alternately with the plurality of second portions along a rotation direction of the rectangular spiral shaped upper surface,
lengths of the plurality of first portions in the first direction decrease along the rotation direction of the rectangular spiral shaped upper surface, and lengths of the plurality of second portions in the second direction decrease along the rotation direction of the rectangular spiral shaped upper surface, and
the plurality of first portions comprise a first material, and the plurality of second portions comprise a second material that is different from the first material.

16. The method of claim 15, wherein the plurality of first portions each comprise an inorganic material layer, and the plurality of second portions each comprise an organic material layer.

17. The method of claim 15, wherein upper surfaces of the plurality of first portions and the plurality of second portions are coplanar with each other.

18. The method of claim 15, further comprising forming the mask structure on the substrate,
wherein forming the mask structure comprises:
forming the plurality of first portions on the substrate; and
after forming the plurality of first portions, forming the plurality of second portions on the substrate, wherein upper surfaces of the plurality of first portions are coplanar with upper surfaces of the plurality of second portions.

19. The method of claim 15, further comprising forming the mask structure on the substrate,
wherein forming the mask structure comprises:
forming the plurality of first portions on the substrate;
after forming the plurality of first portions, forming a preliminary second mask layer on the substrate, wherein the preliminary second mask layer encloses the plurality of first portions in a plan view, and an upper surface of the preliminary second mask layer is coplanar with upper surfaces of the plurality of first portions; and
patterning the preliminary second mask layer, thereby forming the plurality of second portions.

* * * * *